(12) United States Patent
Jung

(10) Patent No.: US 9,859,150 B2
(45) Date of Patent: Jan. 2, 2018

(54) METHOD FOR MANUFACTURING DUAL DAMASCENE STRUCTURE

(71) Applicant: SK hynix Inc., Gyeonggi-do (KR)

(72) Inventor: Jin-Gi Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/207,189

(22) Filed: Jul. 11, 2016

(65) Prior Publication Data

US 2017/0178952 A1    Jun. 22, 2017

(30) Foreign Application Priority Data

Dec. 22, 2015 (KR) .................. 10-2015-0183452

(51) Int. Cl.
| | |
|---|---|
| H01L 21/00 | (2006.01) |
| H01L 21/768 | (2006.01) |
| H01L 21/311 | (2006.01) |
| H01L 21/02 | (2006.01) |
| H01L 21/033 | (2006.01) |

(52) U.S. Cl.
CPC .. H01L 21/76808 (2013.01); H01L 21/02063 (2013.01); H01L 21/02282 (2013.01); H01L 21/0332 (2013.01); H01L 21/31111 (2013.01); H01L 21/31144 (2013.01); H01L 21/7681 (2013.01); H01L 21/76813 (2013.01)

(58) Field of Classification Search
CPC ........... H01L 21/76834; H01L 21/7681; H01L 21/76814; H01L 21/76846; H01L 21/76849; H01L 21/76879

USPC .................................................. 438/618, 622
See application file for complete search history.

(56) References Cited

U.S. PATENT DOCUMENTS

| | | | | |
|---|---|---|---|---|
| 6,133,138 A * | 10/2000 | Ishibashi | ............... | H01L 21/768 |
| | | | | 257/E21.575 |
| 7,067,419 B2 | 6/2006 | Huang et al. | | |
| 7,119,009 B2 * | 10/2006 | Watanabe | ......... | H01L 21/76807 |
| | | | | 257/E21.259 |
| 7,855,142 B2 | 12/2010 | Oh et al. | | |

(Continued)

*Primary Examiner* — Dale E Page
*Assistant Examiner* — Quovaunda V Jefferson
(74) *Attorney, Agent, or Firm* — IP & T Group LLP

(57) ABSTRACT

A method for manufacturing a semiconductor device include forming a dielectric layer over an underlying layer; forming an etch barrier over the dielectric layer, wherein a partial via opening is formed in the etch barrier and exposes a lower portion of the etch barrier; forming an assist-etch barrier over the etch barrier to fill the partial via opening; patterning the assist-etch barrier to form an initial trench opening in the assist-etch barrier, wherein the initial trench opening communicates with the partial via opening; patterning the lower portion of the etch barrier exposed by the partial via opening to form a final via opening in the etch barrier; patterning the dielectric layer exposed by the final via opening to form an initial via hole in the dielectric layer; patterning the etch barrier exposed by the initial trench opening to form a final trench opening in the etch barrier; patterning a lower portion of the dielectric layer exposed by the initial via hole to form a final via hole in the dielectric layer; and patterning a upper portion of the dielectric layer exposed by the final trench opening to form a trench, wherein the trench communicates the final via hole.

11 Claims, 14 Drawing Sheets

(56) References Cited

U.S. PATENT DOCUMENTS 7,884,019 B2 2/2011 Jiang et al.
2004/0198062 A1* 10/2004 Ye ...................... H01L 21/7684
438/706

* cited by examiner

METHOD FOR MANUFACTURING DUAL DAMASCENE STRUCTURE

CROSS-REFERENCE TO RELATED APPLICATION(S)

The present application claims priority of Korean Patent Application No. 10-2015-0183452, filed on Dec. 22, 2015, which is herein incorporated by reference in its entirety.

BACKGROUND

1. Field

Exemplary embodiments of the present invention relate to a method for manufacturing a semiconductor device, and more particularly, to a method for manufacturing a semiconductor device, which involves a damascene process.

2. Description of the Related Art

A damascene process is usually used to form an interconnection between two or more components, for example, between metal lines. During the damascene process, the metal lines or the interconnection may be formed in a dielectric layer.

A dual damascene process is an example of the damascene process. During the dual damascene process, via holes and trenches may be formed by etching a dielectric layer.

SUMMARY

Various embodiments are directed to a method for manufacturing a semiconductor device, which is capable of preventing damage to a dielectric layer during a damascene process.

In an embodiment, a method for manufacturing a semiconductor device may include forming a dielectric layer over an underlying layer; forming an etch barrier over the dielectric layer, wherein a partial via opening is formed in the etch barrier and exposes a lower portion of the etch barrier, forming an assist-etch barrier over the etch barrier to fill the partial via opening; patterning the assist-etch barrier to form an initial trench opening in the assist-etch barrier, wherein the initial trench opening communicates with the partial via opening; patterning the lower portion of the etch barrier exposed by the partial via opening to form a final via opening in the etch barrier; patterning the dielectric layer exposed by the final via opening to form an initial via hole in the dielectric layer patterning the etch barrier exposed by the initial trench opening to form a final trench opening in the etch barrier; patterning a lower portion of the dielectric layer exposed by the initial via hole to form a final via hole in the dielectric layer; and patterning a upper portion of the dielectric layer exposed by the final trench opening to form a trench, wherein the trench communicates the final via hole. The method may further performing a single strip/cleaning process after the forming of the final via hole and the trench. A depth of the initial via hole in the dielectric layer may be smaller than a thickness of the dielectric layer. The patterning a lower portion of the dielectric layer exposed by the initial via hole and the patterning a upper portion of the dielectric layer exposed by the final trench opening may be performed substantially at the same time. The forming of the etch barrier may include forming a first layer over the dielectric layer; forming a second layer over the first layer; forming a via mask over the second layer; patterning the second layer using the via mask; and partially etching the first layer using the via mask to form the partial via opening. A depth of the partial via opening in the first layer may be smaller than a thickness of the first layer. The first layer may include a carbon-containing material. The second layer may include a silicon-containing material. The forming of the assist-etch barrier may include forming a bottom layer covering the etch barrier and filling the partial via opening; and forming a top layer over the bottom layer. The bottom layer may include a carbon-containing material and may be formed by spin-on coating. The top layer may include a silicon-containing material.

In an embodiment, a method for manufacturing a semiconductor device may include forming a dielectric layer over a substrate; forming an etch barrier having a partial trench opening over the dielectric layer; forming an assist-etch barrier filling the partial trench opening over the etch barrier; forming a via opening penetrating the assist-etch barrier and the partial trench opening; extending the via opening to form an initial via hole within the dielectric layer; extending the partial trench opening to form a trench opening in the etch barrier; and etching the dielectric layer using an etch barrier having the trench opening to form a final via hole through which the substrate is exposed and a trench over the final via hole. The method may further performing a single strip/cleaning process after the forming of the final via hole and the trench. A depth of the initial via hole in the dielectric layer may be smaller than a thickness of the dielectric layer. The trench and the final via hole may be formed by an in-situ etch of the dielectric layer in which the initial via hole has been formed. The forming of the etch barrier having the partial trench opening may include forming a first layer over the dielectric layer; forming a second layer over the first layer; forming a trench mask over the second layer; etching the second layer using the trench mask; and etching part of the first layer using the trench mask to form the partial trench opening in the first layer. The partial trench opening may be formed to have a depth smaller than a thickness of the first layer. The first layer may include a carbon-containing material. The second layer may include a silicon-containing material. The forming of the assist-etch barrier may include forming a bottom layer covering the etch barrier and filling the partial via opening; and forming a top layer over the bottom layer. The bottom layer may include a carbon-containing material and may be formed by spin-on coating. The top layer may include a silicon-containing material.

In an embodiment, a method for manufacturing a semiconductor device may include forming a dielectric layer over a substrate; forming an etch barrier having a partial trench opening over the dielectric layer; forming an assist-etch barrier filling the partial trench opening over the etch barrier; forming a via mask having a via hole opening partially overlapping the partial trench opening over the assist-etch barrier; forming a via opening by etching the assist-etch barrier and the partial trench opening so that the via opening is self-aligned in the via hole opening; extending the via opening to form an initial via hole within the dielectric layer; extending the partial trench opening to form a trench opening in the etch barrier; and etching the dielectric layer using an etch barrier having the trench opening to form a final via hole through which the substrate s exposed and a trench over the final via hole. The method may further performing a single strip cleaning process after the forming of the final via hole and the trench. A depth of the initial via hole in the dielectric layer may be smaller than a thickness of the dielectric layer. The trench and the final via hole may be formed by an in-situ etch of the dielectric layer in which the initial via hole has been formed. The forming of the etch barrier having the partial trench opening may include forming a first layer over the dielectric layer; forming a second layer over the first layer; forming a trench mask over the second layer; etching the second layer using the trench mask; and etching part of the first layer using the trench mask to form the partial trench opening in the first layer. The partial trench opening may be formed to have a depth smaller than a thickness of the first layer. The first layer may include a carbon-containing material. The second layer may include a silicon-containing material. The forming of the assist-etch barrier may include forming a bottom layer covering the etch barrier and filling the partial via opening; and forming a top layer over the bottom layer. The bottom layer may include a carbon-containing material and may be formed by spin-on coating. The top layer may include a silicon-containing material.

DETAILED DESCRIPTION

Figure 1A:
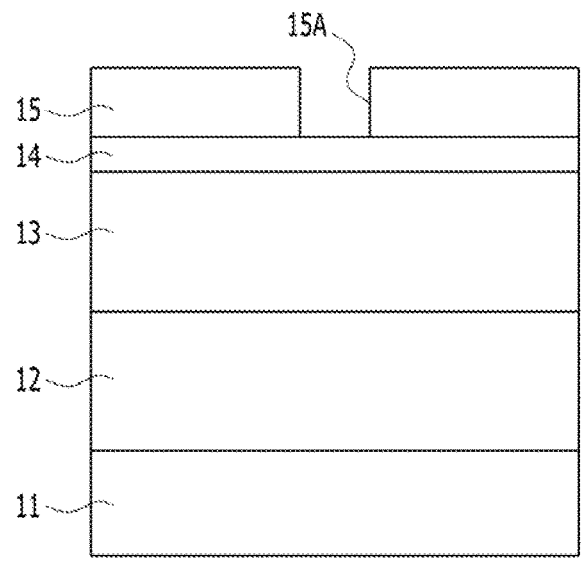
FIGS. 1A-1I illustrate a dual damascene process according to a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or on a substrate, it not only refers to a case in which the first layer is formed directly on the second layer or the substrate but also a case in which a third layer exists between the first layer and the second layer or the substrate.

In a dual damascene process, low-k materials may be used to reduce an RC time delay. In a known dual damascene process, damage to low-k materials may be generated since twice strip/cleaning processes are required. In the following embodiments, damage to low-k materials can be reduced. Furthermore, some embodiments may include a via-first dual damascene process, a trench-first dual damascene process, and a trench-first self-alignment via process. Furthermore, some embodiments may include a partial via-first dual damascene process and a partial trench-first dual damascene process.

FIGS. 1A-1I illustrate a dual damascene process according to a first embodiment. As shown in FIG. 1A, a dielectric layer 12 may be formed on a substrate 11. The substrate 11 may be a material suitable for semiconductor processing. The substrate 11 may include a semiconductor substrate. Metal wiring (not shown) may have been formed in the substrate 11. The dielectric layer 12 may include low-k materials. The dielectric layer 12 may be oxide, low-k materials or a combination of them. The dielectric layer 12 may have a dielectric constant smaller than about 3.

An etch barrier may be formed on the dielectric layer 12. The etch barrier may also be called a hard mask layer. The etch barrier may include a first layer 13 and a second layer 14. The first layer 13 may be formed using a material having an etch selectivity with respect to the dielectric layer 12. The first layer 13 may include a carbon-containing material. The first layer 13 may include an amorphous carbon layer. The second layer 14 may be formed on the first layer 13. The second layer 14 may include a silicon-containing material. The second layer 14 may include a bottom anti-reflective coating (BARC) layer or an anti-reflective coating (ARC) layer. The second layer 14 may be formed between a via mask 15 and the first layer 13 to reduce undesirable reflections during a photolithography process. The second layer 14 may include silicon oxynitride (SION). The second layer 14 may be formed using a material having an etch selectivity with respect to the first layer 13 and the dielectric layer 12.

The via mask 15 may be formed on the etch barrier 13/14. The via mask 15 may have a via hole opening 15A, To form the via mask 15, a photoresist may be formed and then patterned by photolithography. In a plan view, the via hole opening 15A may have a circular form. The via hole opening 15A may have a shape corresponding to the via hole of a dual damascene opening.

Figure 1B:
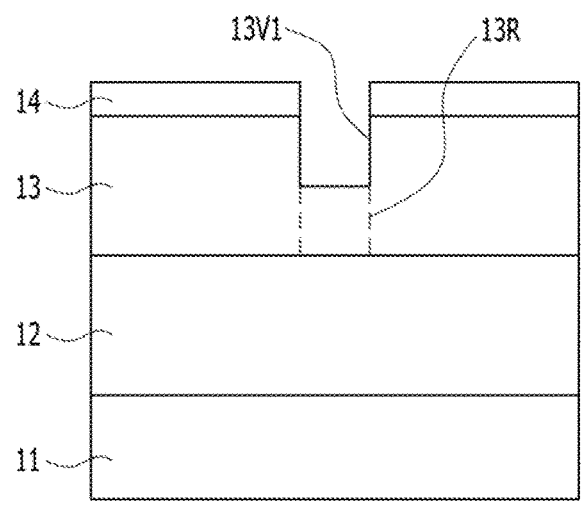

As shown in FIG. 1B, part of the second layer 14 and the first layer 13 may be etched. The second layer 14 and the first layer 13 may be etched using the via mask 15 as an etch mask. The first layer 13 may be partially etched. Accordingly, a partial via opening 13V1 may be formed in the first layer 11. In a plan view, the partial via opening 13V1 and the via hole opening 15A may have the same shape. The via hole opening 15A may be transferred to the first layer 13 and thus the partial via opening 13V1 may be formed. For example, the partial via opening 13V1 may have a circular form. The bottom of the partial via opening 13V1 may not be exposed to the dielectric layer 12. That is, the remaining portion 13R of the first layer 13 may be placed below the partial via opening 13V1. The partial via opening 13V1 in the first layer 13 may have a depth smaller than the thickness of the first layer 13.

After the first layer 13 is etched, the via mask 15 may be stripped. The via mask 15 may be removed by oxygen ashing. While the via mask 15 is stripped, there is no damage to the dielectric layer 12.

Figure 1C:
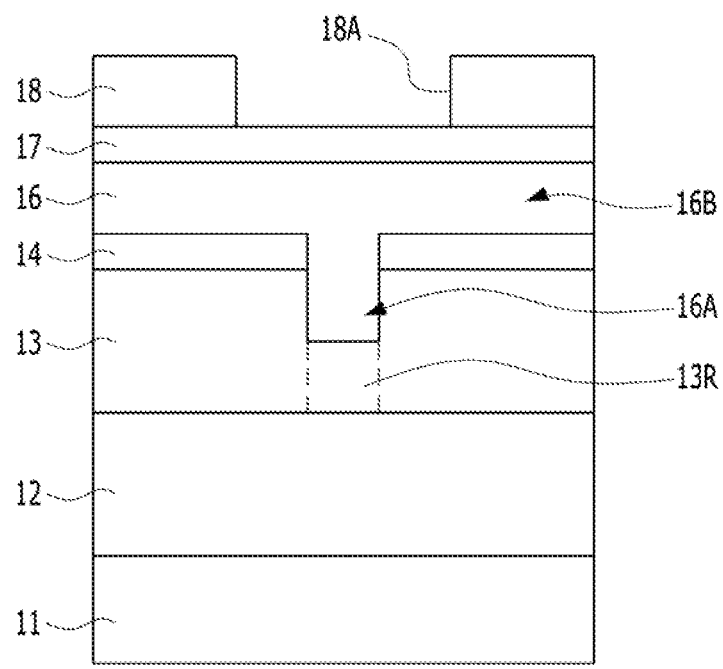

As shown in FIG. 1C, an assist-etch barrier may be formed. The assist-etch barrier may include a bottom layer 16 filling the partial via opening 13V1. The assist-etch barrier may include the bottom layer 16 and a top layer 17.

The bottom layer 16 may fill the partial via opening 13V1. The bottom layer 16 may be formed by a spin-on coating method. The bottom layer 16 may be formed on the second layer 14 while filling the partial via opening 13V1. The bottom layer 16 may include a carbon-containing material. The bottom layer 16 may include a spin-on carbon layer. The bottom layer 16 may include a first portion 16A filling the partial via opening 13V1 and a second portion 16B covering the second layer 14.

The top layer 17 may be formed on the bottom layer 16. The top layer 17 and the second layer 14 may be the same material. The top layer 17 may be a silicon-containing material. The top layer 17 may include a BARC layer or an ARC layer. The top layer 17 may be formed between a trench mask 18 and the bottom layer 16 to reduce undesirable reflections during a photolithography process. The top layer 17 may include silicon oxynitride (SiON).

As described above, the first layer 13 of the etch barrier and the bottom layer 16 of the assist-etch barrier may be the same material, and the second layer 14 of the etch barrier and the top layer 17 of the assist-etch barrier may be the same material. The first layer 13 of the etch barrier and the bottom layer 16 of the assist-etch barrier may be carbon-containing materials. The second layer 14 of the etch barrier and the top layer 17 of the assist-etch barrier may be silicon-containing materials. Subsequent etch processes may be selectively performed since the carbon-containing material and the silicon-containing material have different etch selectivity from each other.

The trench mask 18 may be formed on the assist-etch barrier, that is, the top layer 17. The trench mask 18 may have a trench opening 18A. To form the trench mask 18, a photoresist may be formed and then patterned by photolithography. In a plan view, the trench opening 18A may be a quadrangle or a line form. The trench opening 18A may have a line width greater than the diameter of the partial via opening 13V1. The trench opening 18A may have a shape corresponding to the trench of a dual damascene opening.

Figure 1D:
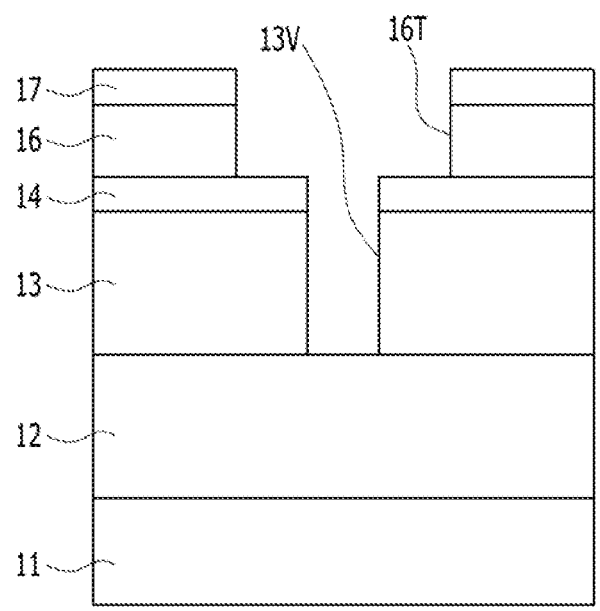

As shown in FIG. 1D, the assist-etch barrier may be etched. Accordingly, the bottom layer 16 may be removed from the partial via opening 13V1. That is, part of the top layer 17 and the bottom layer 16 may be etched away. The top layer 17 and the bottom layer 16 may be sequentially etched using the trench mask 18 as an etch mask. The first portion 16A of the bottom layer 16 may be fully etched away, and thus the partial via opening 13V1 may be opened again. A first initial trench opening 16T may be formed since part of the second portion 16B of the bottom layer 16 is etched.

After the bottom layer 16 is etched the first layer 13 may be etched. Accordingly, a final via opening 13V through which a surface of the dielectric layer 12 is exposed may be formed. That is, the remaining portion 13R of the first layer 13 may be etched so that the bottom of the partial via opening 13V1 is extended. In this case, the second layer 14 may be used as an etch mask. The final via opening 13V may have the same diameter as the partial via opening 13V1.

While the final via opening 13V is formed, the trench mask 18 may be also completely etched away. For example, the trench mask 18 may be fully consumed while etching the remaining portion 13R of the first layer 13. Furthermore, since the second layer 14 may serve as an etch mask, the remaining portion 13R of the first layer 13 may be selectively etched.

As described above, an etch barrier having, the final via opening 13V and the first initial trench opening 16T may be formed over the dielectric layer 12. The etch barrier may include an etch barrier and an assist-etch barrier. The final via opening 13V may be formed in the etch barrier, and the first initial trench opening 16T may be formed in the assist-etch barrier.

Figure 1E:
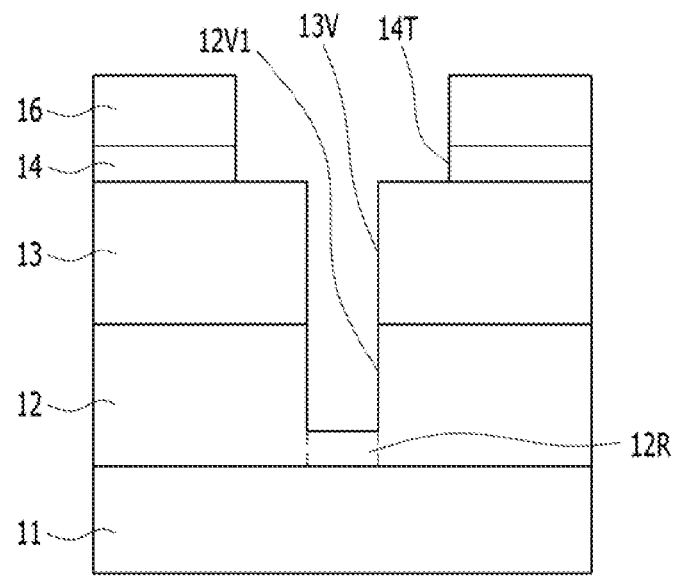

As shown in FIG. 1E, an initial via hole 12V1 may be formed in the dielectric layer 12. The initial via hole 12V1 may have the same shape as the final via opening 13V. To form the initial via hole 12V1, part of the dielectric layer 12 may be etched. The dielectric layer 12 may be etched so that a surface of the substrate 11 is not exposed. Accordingly, a remaining portion 12R may be placed below the initial via hole 12V1. The initial via hole 12V1 in the dielectric layer 12 may have a depth smaller than the thickness of the dielectric layer 12, In some cases, while part of the dielectric layer 12 is etched, the top layer 17 may also be completely etched away. In addition, part of the second layer 14 may also be etched away. However, even in that case, the first layer 13 may serve as an etch mask while the dielectric layer 12 is partially etched.

While the initial via hole 12V1 is formed, a second initial trench opening 14T may be formed in the second layer 14. The second initial trench opening 14T may have the same shape as the first initial trench opening 16T of the bottom layer 16. That is, the shape of the first initial trench opening 16T may be transferred to the second initial trench opening 14T.

Figure 1F:
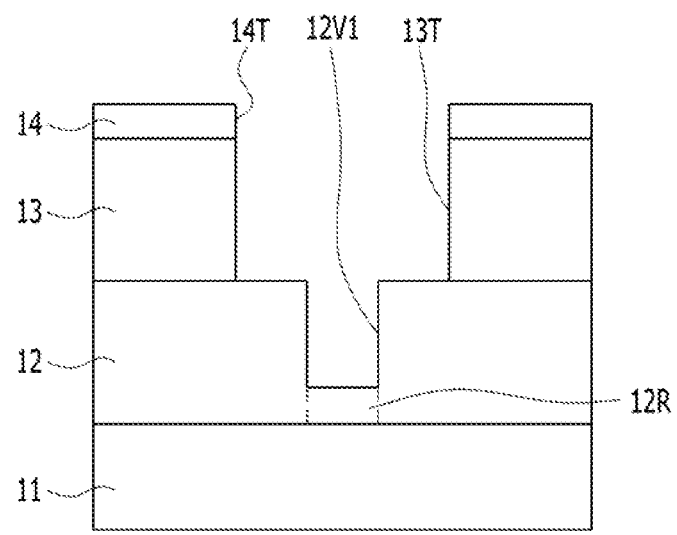

As shown in FIG. 1F, a final trench opening 13T may be formed. To form the final trench opening 13T, the first layer 13 may be etched. The final trench opening 13T may be formed in the first layer 13. While the first layer 13 is etched, the second layer 14 may be used as an etch mask. While the first layer 13 is etched, the bottom layer 16 may be completely etched away. The final trench opening 13T may have the same shape as the second initial trench opening 14T of the second layer 14.

Since etch is not performed on the dielectric layer 12, the remaining portion 12R of the dielectric layer 12 may be placed below the initial via hole 12V1. As a result, an etch barrier having the final trench opening 13T can be formed by a series of such processes, and the initial via hole 12V1 may be formed in the dielectric layer 12 while forming the etch barrier.

Figure 1G:
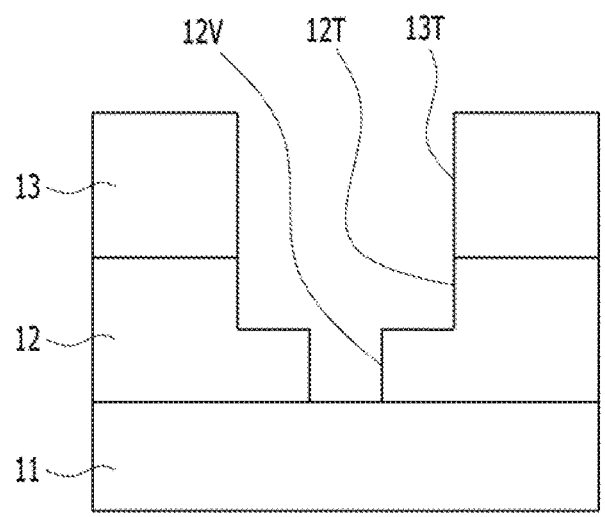

As shown in FIG. 1G, a trench 12T may be formed in the dielectric layer 12. The dielectric layer 12 may be etched using the first layer 13 as an etch mask. Accordingly, the trench 12T may be formed. A process for forming the trench 12T in the dielectric layer 12 is referred to as "trench etch." While the trench 12T is formed, the remaining portion 12R of the dielectric layer 12 may be etched. Accordingly, a final via hole 12V may be formed. A process for forming the final via hole 12V is referred to as "via etch." The second layer 14 may not remain.

As described above, trench 12T and the final via hole 12V can be formed by in-situ etching the dielectric layer 12 using the etch barrier having the final trench opening 13T.

The final via hole 12V and the trench 12T may form a dual damascene opening. The first embodiment may correspond to a via-first dual damascene opening. That is, after a via hole is defined, a trench may be formed. In the first embodiment, a via etch and a trench, etch are performed at the same time.

Figure 1H:
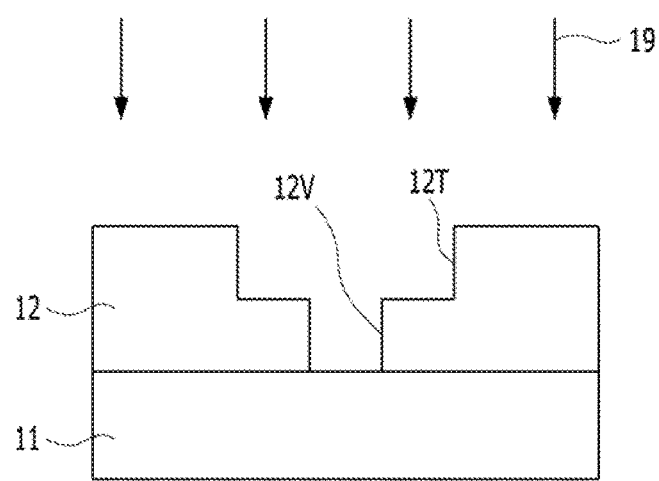

As shown in FIG. 1H, the first layer 13 may be removed. The first layer 13 may be removed by a photoresist strip process. In another embodiment, the first layer 13 may be removed by oxygen asking, for example. Thereafter, a cleaning process may be performed to remove any etch by-products.

Damage to the dielectric layer 12 in which the final via hole 12V and the trench 12T have been formed as described above can be minimized since the dielectric layer 12 is exposed to a single strip/cleaning process 19.

In another embodiment, the single strip/cleaning process 19 may be performed by a plasma strip using gas including $N_2/H_2$.

Figure 1I:
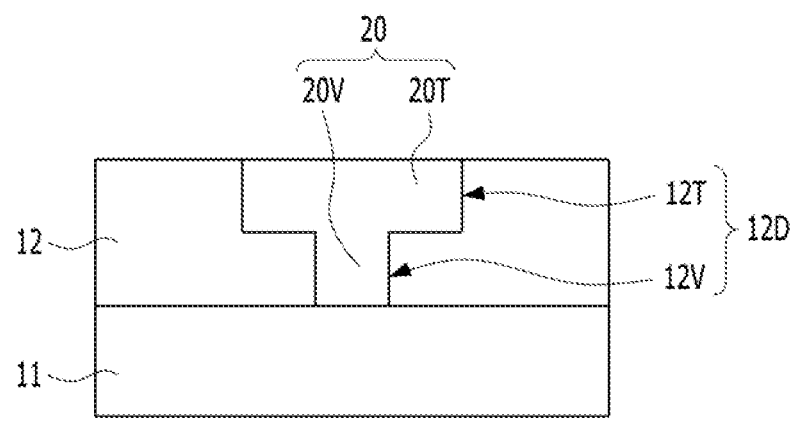

As shown in FIG. 1I, to form a dual damascene structure 20, the final via hole 12V and the trench 12T may be filled with a conductive material. The conductive material may include a metallic material. For example, the conductive material may include aluminum, copper, or tungsten. The conductive material may be exposed to a polishing process, such as CMP.

The dual damascene structure 20 may include a first portion 20V and a second portion 20T. The first portion 20V may be a portion filled in the final via hole 12V of a dual damascene opening 12D. The second portion 20T may be a portion filled in the trench 12T of the dual damascene opening 12D. The first portion 20V may be called a via or plug. The second portion 20T may be called wiring or a line pattern. The second portion 20T may be called metal wiring since the material filled in the trench 12T of the dual damascene opening 12D is a metal is material. In another embodiment, when the substrate 11 includes lower metal wiring, the second portion 20T may be called upper metal wiring.

Figure 1J:
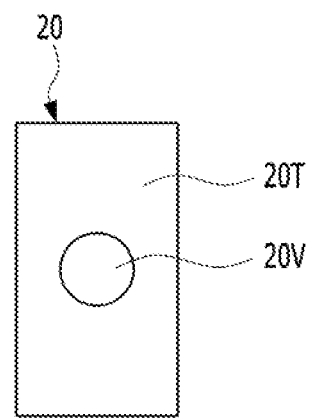
FIG. 1J is a plan view of a dual damascene structure according to the first embodiment.

FIG. 1J is a plan view of the dual damascene structure 20. The second portion 20T of the dual damascene structure 20 may fully overlap the first portion 20V. The second portion 20T may be a quadrangle or a line form. The first portion 20V may have a circular form.

As described above, in the first embodiment, only a single strip/cleaning process is applied to the dielectric layer 12 since the via etch and the trench etch are performed at the same time. Accordingly, damage to the dielectric layer 12 can be suppressed. Comparing with a comparison example in which a via etch and a trench etch are separately performed, at least two strip/cleaning processes may be applied to the dielectric layer 12. One process may be applied to form the via etch and another process may be applied to form the trench etch. Accordingly, damage to the dielectric layer is inevitable.

In contrast, the first embodiment can suppress damage to the dielectric layer 12 since only a single strip/cleaning process 19 is performed on the dielectric layer 12 in which the dual damascene opening 12D has been formed, thereby being capable of improving the reliability of the dual damascene structure 20.

Figure 2A:
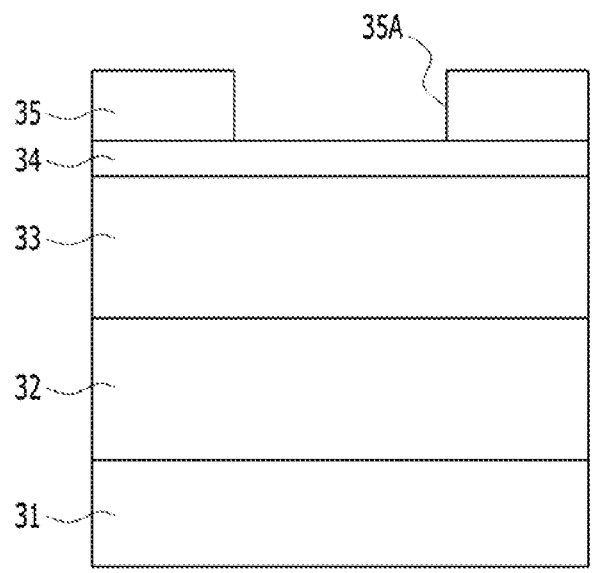
FIGS. 2A-2H illustrate a dual damascene process according to a second embodiment.

FIGS. 2A to 2H illustrate a dual damascene process according to a second embodiment. As shown in FIG. 2A, a dielectric layer 32 may be formed on a substrate 31. The substrate 31 may be a material suitable for semiconductor processing. The substrate 31 may include a semiconductor substrate. Metal wiring (not shown) may have been formed in the substrate 31. The dielectric layer 32 may include low-k materials. The dielectric layer 32 may be oxide, low-k materials or a combination of them. The dielectric layer 32 may have a dielectric constant smaller than about 3.

An etch barrier may be formed on the dielectric layer 32. The etch barrier may include a first layer 33 and a second layer 34. The first layer 33 may be formed using a material having an etch selectivity with respect to the dielectric layer 32. The first layer 33 may include a carbon-containing material. The first layer 33 may include an amorphous carbon layer. The second layer 34 may be formed on the first layer 33. The second layer 34 may include a silicon-containing material. The second layer 34 may include a BARC layer or an ARC layer. The second layer 34 may be formed between a trench mask 35 and the first layer 33 to reduce undesirable reflections during a photolithography process. The second layer 34 may include silicon oxynitride (SiON). The second layer 34 may be formed using a material having an etch selectivity with respect to the first layer 33 and the dielectric layer 32.

The trench mask 35 may be formed on the etch barrier that is, the second layer 34. The trench mask 35 may include a trench opening 35A. To form the trench mask 35, a photoresist may be formed and then patterned by photolithography. In a plan view, the trench opening 35A may be a rectangle or a line form. The trench opening 35A may have a shape corresponding to the trench of a dual damascene opening.

Figure 2B:
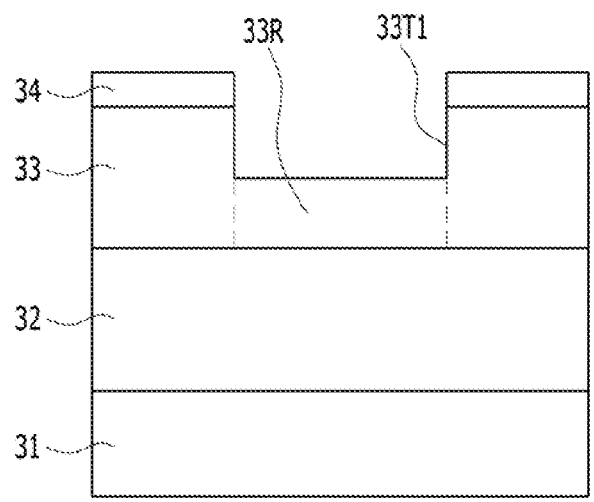

As shown in FIG. 2B, part of the second layer 34 and the first layer 33 may be etched. The second layer 34 and the first layer 33 may be etched using the trench mask 35 as an etch mask. The first layer 33 may be partially etched. Accordingly, a partial trench opening 33T1 may be formed in the first layer 33. In a plan view, the partial trench opening 33T1 and the trench opening 35A may have the same shape. The trench opening 35A may be transferred to the first layer 33, so the partial trench opening 33T1 may be formed. For example, the partial trench opening 33T1 may be a rectangle or a line form. The bottom of the partial trench opening 33T1 may not be exposed to the dielectric layer 32. That is, the remaining portion 33R of the first layer 33 may be placed below the partial trench opening 33T1. The partial trench opening 33T1 in the first layer 33 may have a depth smaller than the thickness of the first layer 33.

After the first layer 33 is etched, the trench mask 35 may be stripped. The trench mask 35 may be removed by oxygen ashing. When the trench mask 35 is stripped, there is no damage to the dielectric layer 32.

Figure 2C:
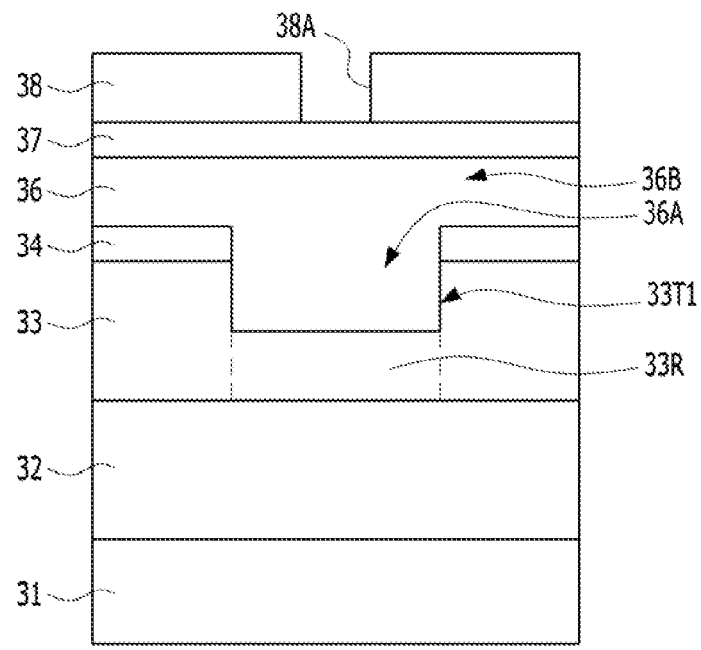

As shown in FIG. 2C, an assist-etch barrier may be formed. The assist-etch barrier may include a bottom layer 36 and a top layer 37.

The bottom layer 36 may fill the partial trench opening 33T1. The bottom layer 36 may include a carbon-containing material. The bottom layer 36 may be formed by a spin-on coating method. The bottom layer 36 may be formed on the second layer 34 while filling the partial trench opening 33T1. The bottom layer 36 may include a spin-on carbon layer. The bottom layer 36 may include a first portion 36A filling the partial trench opening 33T1 and a second portion 36B covering the second layer 34.

The top layer 37 may be formed on the bottom layer 36. The top layer 37 and the second layer 34 may be the same material. The top layer 37 may include a silicon-containing material. The top layer 37 may include a BARC layer or an ARC layer. The top layer 37 may be formed between the via mask 38 and the bottom layer 36 in order to reduce undesirable reflections during a photolithography process. The top layer 37 may include silicon oxynitride (SiON).

A via mask 38 may be formed on the assist-etch barrier, that is, the top layer 37. The via mask 38 may include a via hole opening 38A. To form the via mask 38, a photoresist may be formed and then patterned by photolithography. In a plan view, the via hole opening 38A may have a circular form. The via hole opening 38A may have a diameter smaller than the line width of the partial trench opening 33T1. The via hole opening 38A may have a shape corresponding to the via hole of a dual damascene opening.

Figure 2D:
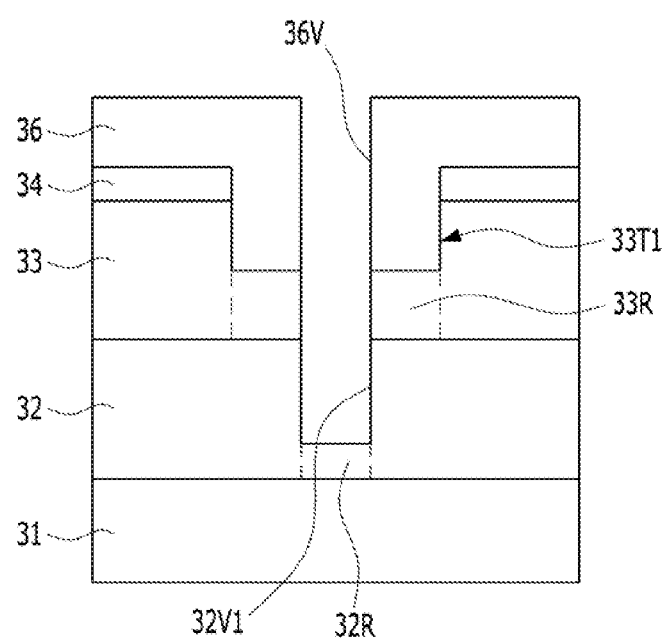

As shown in FIG. 2D, part of the top layer 37 and the bottom layer 36 may be etched. The top layer 37 and the bottom layer 36 may be etched using the via mask 38 as an etch mask. A via opening 36V may be formed by etching part of the first portion 36A and second portion 36B of the bottom layer 36 at the same time.

After the bottom layer 36 is etched, part of the first layer 33 may be etched. Accordingly, the via opening 36V may be downward extended. The via opening 36V may pass through the bottom layer 36 and extend into the first layer 33. The via opening 36V may penetrate the assist-etch barrier and the partial trench opening 33T1.

Next, part of the dielectric layer 32 may be etched. Accordingly, an initial via hole 32V1 may be formed within the dielectric layer 32. The initial via hole 32V1 may be formed below the via opening 36V. That is, the initial via hole 32V1 may be formed by extending the via opening 36V. The initial via hole 32V1 may have the same diameter as the via opening 36V. Next, the via mask 38 may be stripped.

Part of the remaining portion 33R of the first layer 33 may be selectively etched since the bottom layer 36 may be used as an etch mask while the initial via hole 32V1 is formed. The dielectric layer 12 may be etched so that a surface of the substrate 11 is not exposed. Accordingly, the remaining portion 32R may be placed below the initial via hole 32V1. The initial via hole 32V1 in the dielectric layer 32 may have a depth smaller than the thickness of the dielectric layer 32. While the dielectric layer 32 is partially etched, the top layer 37 may be completely etched away. In that case, while the dielectric layer 32 is partially etched, the bottom layer 36 may be used as an etch mask.

Figure 2E:
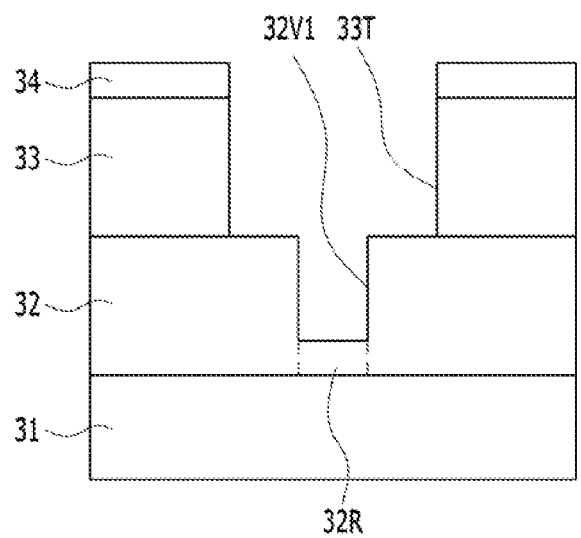

As shown in FIG. 2E a trench opening 33T may be formed in the etch barrier, that is, the first layer 33. In a plan view, the trench opening 33T may have the same shape as the partial trench opening 33T1. For example, the trench opening 33T may be formed by extending the partial trench opening 33T1. To form the trench opening 33T, the remaining portion 33R of the first layer 33 may be fully etched so that the dielectric layer 32 is exposed.

The trench opening 33T may be formed in the first layer 33. While the remaining portion 33R of the first layer 33 is etched, the second layer 34 may be used as an etch mask. While the remaining portion 33R of the first layer 33 is etched, the bottom layer 36 may also be etched away. Accordingly, while the remaining portion 33R of the first layer 33 is etched, the second layer 34 may be used as an etch mask. Since etch is not performed on the dielectric layer 32, the remaining portion 32R of the dielectric layer 32 may still be placed below the initial via hole 32V1.

Figure 2F:
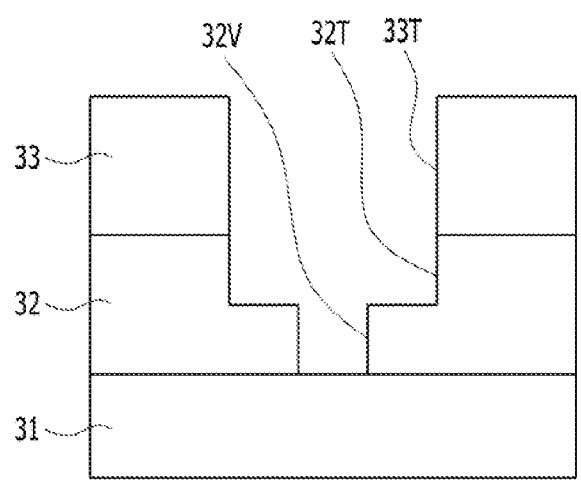

As shown in FIG. 2F a trench 32T may be formed in the dielectric layer 32. The dielectric layer 32 may be etched using the first layer 33 as an etch mask until the substrate 31 is exposed. Accordingly, the trench 32T may be formed. A process for forming the trench 32T in the dielectric layer 32 is referred to as "trench etch." While the trench 32T is formed, the remaining portion 32R of the dielectric layer 32 may be etched, so a final via hole 32V may be formed. A process for forming the final via hole 32V is referred to as "via etch." The second layer 34 may not remain. A surface of the substrate 31 may be exposed through the final via hole 32V.

A dual damascene opening including the via hole 32V and the trench 32T may be formed by a series of etching processes. The second embodiment may correspond to a trench-first dual damascene openings That is, after the trench 32T is formed, the via hole 32V may be formed. In the second embodiment, a via etch and a trench etch are performed at the same time. That is, the final via hole 32V and the trench 32T can be formed at the same time by in-situ etching the dielectric layer 32.

Figure 2G:
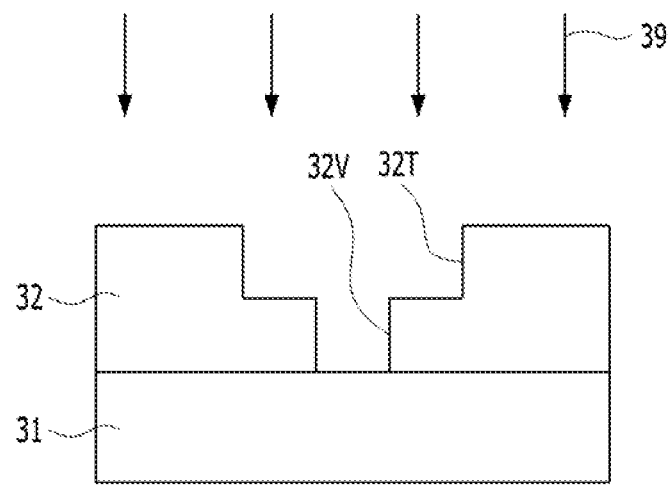

As shown in FIG. 2G, the first layer 33 may be removed. The first layer 33 may be removed by a photoresist strip process. For example, the first layer 33 may be removed by oxygen ashing. Next, a cleaning process may be performed to remove etch by-products.

As described above, damage to the dielectric layer 32 in which the final via hole 32V and the trench 32T have been formed can be minimized since the dielectric layer 32 is exposed to only a single strip/cleaning process 39. In another embodiment, the single strip/cleaning process 39 may be performed by a plasma strip using gas including $N_2/H_2$.

Figure 2H:
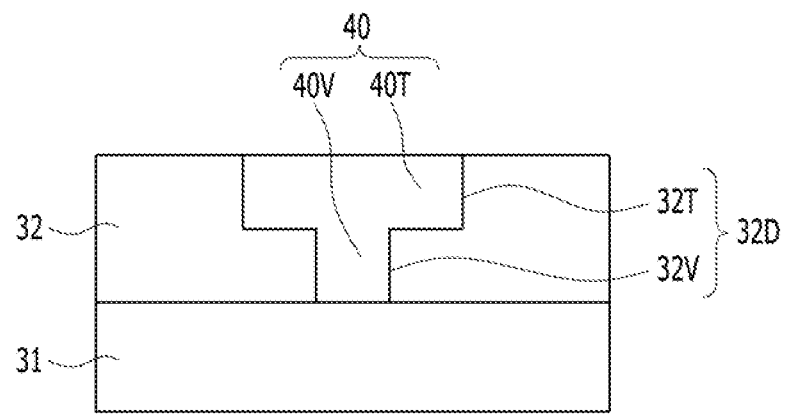

As shown in FIG. 2H, to form a dual damascene structure 40, the final via hole 32V and the trench 32T may be filled with a conductive material. The conductive material may include a metallic material. For example, the conductive material may include aluminum, copper, or tungsten. The conductive material may be planarized by a polishing process, such as CMP, using the dielectric layer 32 as an etch mask.

The dual damascene structure 40 may include a first portion 40V and a second portion 40T. The first portion 40V may be a portion filled in the final via hole 32V of a dual damascene opening 32D. The second portion 40T may be a portion filled in the trench 32T of the dual damascene opening 32D. The first portion 40V may be called a via or plug. The second portion 40T may be called wiring or a line pattern. Since the material filled in the trench 32T is a metallic material, the second portion 40T may be called metal wiring. In another embodiment, when the substrate 31 includes lower metal wiring, the second portion 40T may be called upper metal wiring.

Figure 2I:
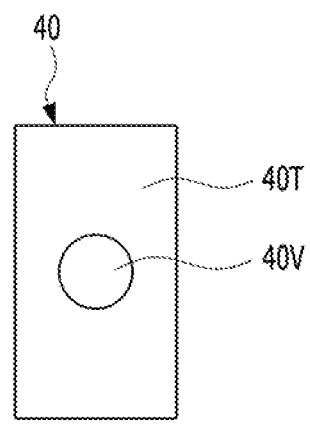
FIG. 2I is a plan view of a dual damascene structure according to the second embodiment.

FIG. 2I is a plan view of the dual damascene structure 40. The second portion 40T of the dual damascene structure 40 may fully cover or overlap the first portion 40V. The second portion 40T may be a quadrangle or a line form. The first portion 40V may have a circular form.

As described above, in the second embodiment, only a single strip/cleaning process 39 is required since the via etch and the trench etch are performed at the same time. Accordingly, damage to the dielectric layer 32 can be suppressed thereby improving the reliability of the dual damascene structure 40.

Figure 3A:
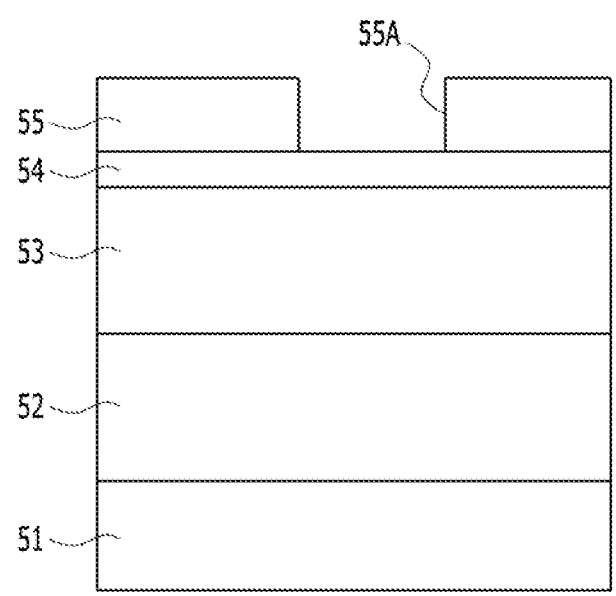
FIGS. 3A-3H illustrate a dual damascene process according to a third embodiment.

FIGS. 3A to 3H illustrate a dual damascene process according to a third embodiment. As shown in FIG. 3A, a dielectric layer 52 may be formed on a substrate 51. The substrate 51 may be a material suitable for semiconductor processing. The substrate 51 may include a semiconductor substrate. Metal wiring (not shown) may have been formed in the substrate 51. The dielectric layer 52 may include low-k materials. The dielectric layer 52 may be oxide, low-k materials or a combination of them. The dielectric layer 52 may have a dielectric constant smaller than about 3.

An etch barrier may be formed on the dielectric layer 52. The etch barrier may include a first layer 53 and a second layer 54. The first layer 53 may be formed using a material having an etch selectivity with respect to the dielectric layer 52. The first layer 53 may include a carbon-containing material. The first layer 53 may include an amorphous carbon layer.

The second layer 54 may be formed on the first layer 53, The second layer 54 may include a silicon-containing material. The second layer 54 may include a BARC layer or an ARC layer. The second layer 54 may be formed between a trench mask 55 and the first layer 53 to reduce undesirable reflections during a photolithography process. The second layer 54 may include silicon oxynitride (SION). The second layer 54 may be formed using a material having an etch selectivity with respect to the first layer 53 and the dielectric layer 52.

The trench mask 55 may be formed on the etch barrier, that is, the second layer 54. The trench mask 55 may have a trench opening 55A, To form the trench mask 55, a photoresist may be formed and then patterned by photolithography. In a plan view, the trench opening 55A may be a rectangle or a line form. The trench opening 55A may have a shape corresponding to the trench of a dual damascene opening.

Figure 3B:
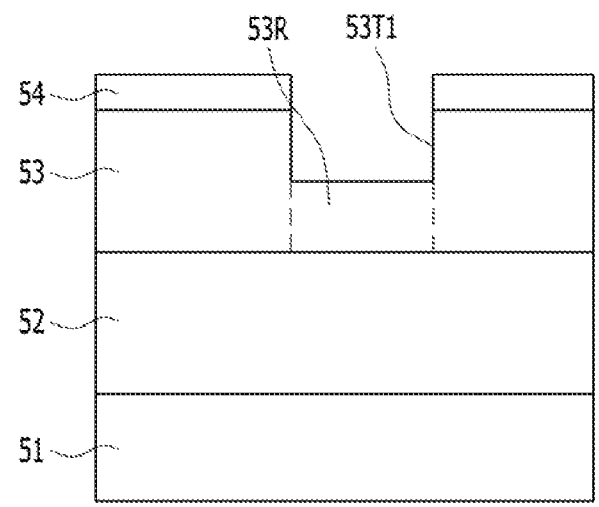

As shown in FIG. 3B, part of the second layer 54 and the first layer 53 may be etched. The second layer 54 and the first layer 53 may be etched using the trench mask 55 as an etch mask. The first layer 53 may be partially etched. Accordingly, a partial trench opening 53T1 may be formed in the first layer 53. In a plan view, the partial trench opening 53T1 and the trench opening 55A may have the same shape. The shape of the trench opening 55A may be transferred to the first layer 53, so the partial trench opening 53T1 may be formed. For example, in a plan view, the partial trench opening 53T1 may be a rectangle or a line form.

The bottom of the partial trench opening 53T1 may not be exposed to the dielectric layer 52. That is, the remaining portion 53R of the first layer 53 may be placed below the partial trench opening 53T1. The partial trench opening 53T1 in the first layer 53 may have a depth smaller than the thickness of the first layer 53.

After the first layer 53 is etched, the trench mask 55 may be stripped. The trench mask 55 may be removed by oxygen ashing. When the trench mask 55 is stripped, there is no damage to the dielectric layer 52.

Figure 3C:
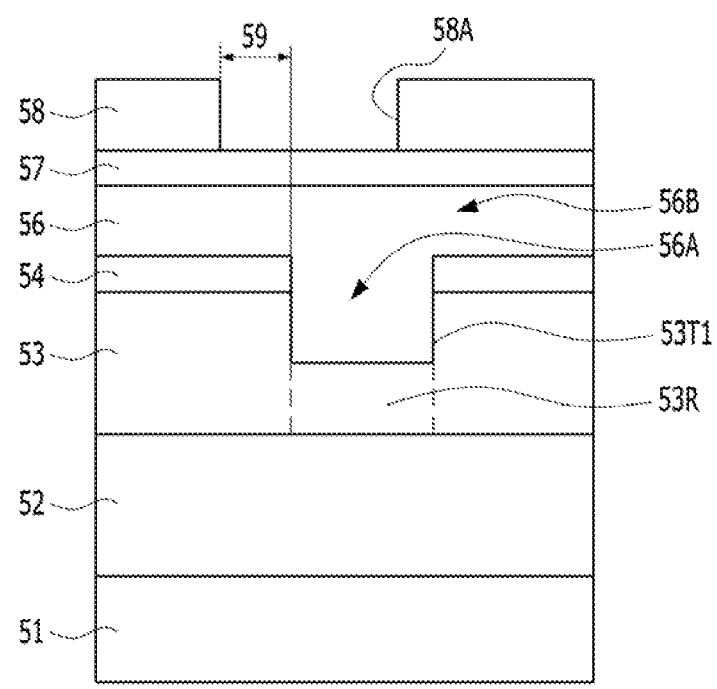

As shown in FIG. 3C, an assist-etch barrier may be formed. The assist-etch barrier may include a bottom layer 56 and a top layer 57. The bottom layer 56 may fill the partial trench opening 53T1. The bottom layer 56 may include a carbon-containing material. The bottom layer 56 may be formed by a spin-on coating method. The bottom layer 56 may be formed on the second layer 54 while filling the partial trench opening 53T1. The bottom layer 56 may include a spin-on carbon layer. The bottom layer 56 may include a first portion 56A filling the partial trench opening 53T1 and a second portion 568 covering the second layer 54.

The top layer 57 may be formed on the bottom layer 56, The top layer 57 and the second layer 54 may be the same material. The top layer 57 may include a silicon-containing material. The top layer 57 may include a BARC layer or an ARC layer. The top layer 57 may be formed between a via mask 58 and the bottom layer 56 to reduce undesirable reflections during a photolithography process. The top layer 57 may include silicon oxynitride (SiON).

The via mask 58 may be formed on the assist-etch barrier, that is, the top layer 57. The via mask 58 may include a via hole opening 58A. To form the via mask 58, a photoresist may be formed and then patterned by photolithography. In a plan view, the via hole opening 58A may have a circular form. The via hole opening 58A may have a width smaller than the line width of the partial trench opening 53T1. The via hole opening 58A may have a shape corresponding to the via hole of a dual damascene opening.

The via mask 58 according to the third embodiment may be different from the via mask 38 according to the second embodiment. That is, in the third embodiment, the via hole opening 58A partially opens the partial trench opening 53T1, rather than completely opening the partial trench opening 53T1. See a partial overlap 59 in FIG. 3C. A self-aligned etch is possible in a subsequent via hole etch process by such partial overlap 59.

Figure 3D:
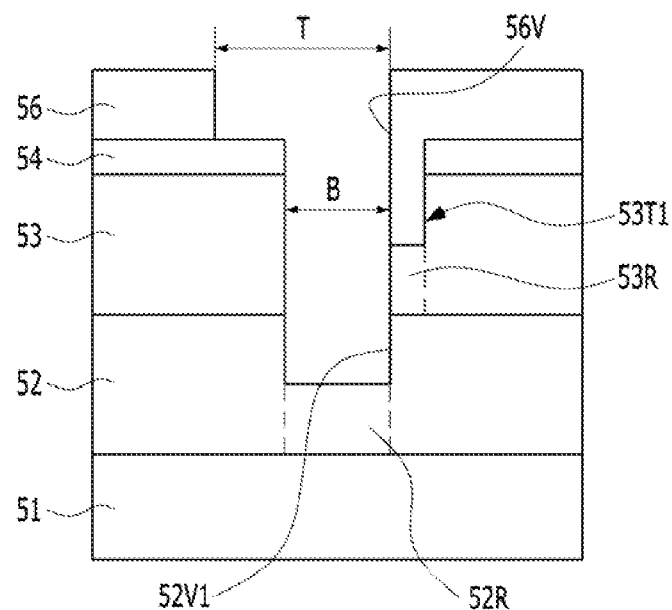

As shown in FIG. 3D, part of the top layer 57 and the bottom layer 56 may be etched. The top layer 57 and the bottom layer 56 may be etched using the via mask 58 as an etch mask. A via opening 56V may be formed by etching part of the first portion 56A and second portion 568 of the bottom layer 56 at the same time. A bottom portion and a top portion T of the via opening 56V may have different widths from each other. The top portion T of the via opening 56V may have a greater width than the bottom portion B. The bottom portion B of the via opening 56V may have a width smaller than the line width of the partial trench opening 58A.

As described above, the via opening 56V may be formed by etching the top layer 57 and the lower layer 56 using the via mask 58 as an etch mask. The via opening 56V is self-aligned with the via hole opening 58A and the partial trench opening 53T1.

After the bottom layer 56 is etched, part of the remaining portion 53R of the first layer 53 and the dielectric layer 52 may be etched. Accordingly, an initial via hole 52V1 may be formed in the dielectric layer 52. The initial via hole 52V1 may extend down from the via opening 56V into the dielectric layer 52. That is, the initial via hole 52V1 may be formed by extending the via opening 56V downwards. The initial via hole 52V1 may have the same width as the bottom portion B of the via opening 56V, As described above, the initial via hole 52V1 may have a smaller width than the via hole opening 58A, That is, the initial via hole 52V1 may have a width smaller than a width T of the via hole opening 58A of the via mask 58. Next, the via mask 58 may be stripped.

Part of the remaining portion 53R of the first layer 53 may be selectively etched while the initial via hole 52V1 is formed using the bottom layer 56 as an etch mask. The dielectric layer 52 may be etched so that a surface of the substrate 51 is not exposed. Accordingly, remaining portion 52R may be placed below the initial via hole 52V1. While part of the dielectric layer 52 is etched, the top layer 57 may be also etched away. Furthermore, while the dielectric layer 52 is partially etched, the bottom layer 56 may be used as an etch mask. Part of the partial trench opening 53T1 may be filled with the bottom layer 56. Accordingly, the remaining portion 53R of the first layer 53 may remain below the partial trench opening 53T1.

Figure 3E:
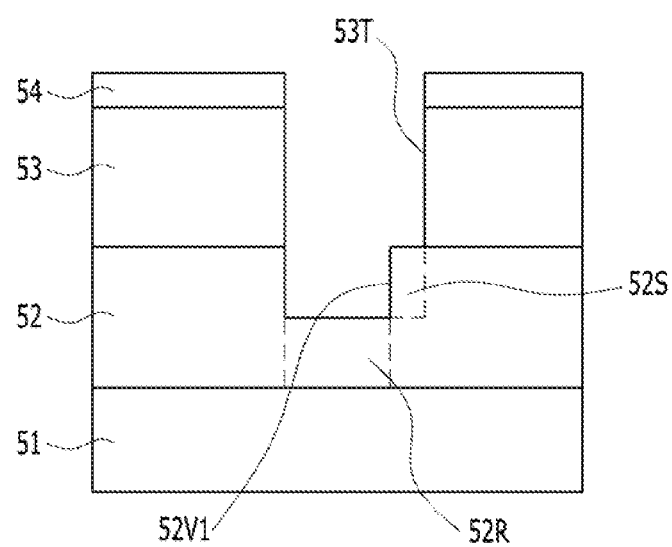

As shown in FIG. 3E, a trench opening 53T may be formed in the first layer 53. The trench opening 53T may have the same line width as the partial trench opening 53T1. To form the trench opening 53T, the remaining portion (53R of FIG. 3d) of the first layer 53 may be fully etched. The trench opening 53T may be formed by extending the partial trench opening 53T1.

The trench opening 53I may be formed in the first layer 53 of the etch barrier. While the remaining portion 53R of the first layer 53 is etched, the second layer 54 may be used as an etch mask. While the remaining portion 53R of the first layer 53 is etched, the bottom layer 56 may also be etched. Accordingly, while the remaining portion 53R of the first layer 53 is etched, the second layer 54 may be used as an etch mask.

Since an etch is not performed on the dielectric layer 52, the remaining portion 52R of the dielectric layer 52 may be placed below the initial via hole 52V1. Furthermore, the dielectric layer 52 may include a protruded portion 52S. The protruded portion 52S may be placed below the trench opening 53T.

Figure 3F:
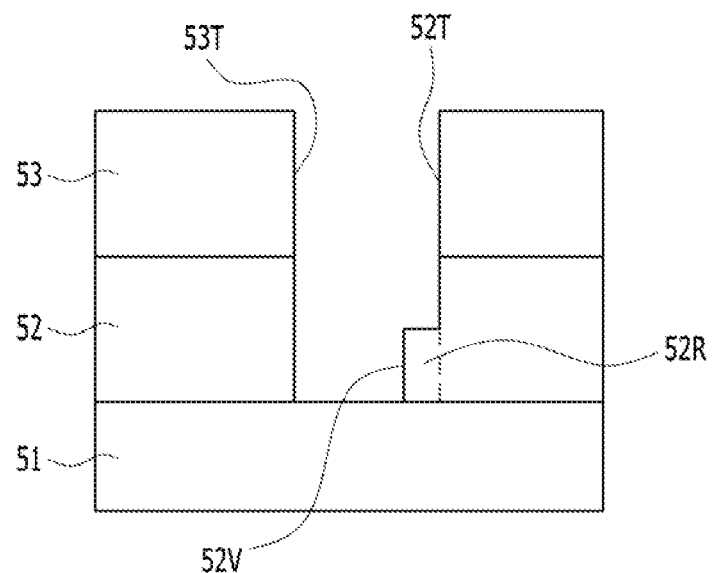

As shown in FIG. 3F, a trench 52T may be formed in the dielectric layer 52. The protruded portion (52S of FIG. 3e) of the dielectric layer 52 may be etched away using the first layer 53 as an etch mask. Accordingly the trench 52T may be formed. A process for forming the trench 52T in the dielectric layer 52 is referred to as "trench etch." While the trench 52T is formed, the remaining portion 52R of the dielectric layer 52 may be etched. Accordingly, a final via hole 52V may be formed. A process for forming the final via hole 52V is referred to as "via etch." The second layer 54 may be etched away while the trench 52T and the final via hole 52V are formed.

A dual damascene opening including the final via hole 52V and the trench 52T may be formed by a series of such processes as described above. The third embodiment may correspond to a trench-first dual damascene opening. That is, after the trench 52T is defined, the final via hole 52V may be formed. Furthermore, in the third embodiment, the final via hole 52V may be a self-alignment via (SAV). A first sidewall of the final via hole 52V may be self-aligned with a first sidewall of the trench opening 53T.

In the third embodiment, a via etch and a trench etch are performed at the same time. That is, the final via hole 52V and the trench 52T can be formed at the same time by in-situ etching the dielectric layer 52 in which the initial via hole 52V1 has been formed using the etch barrier having the trench opening 53T.

Figure 3G:
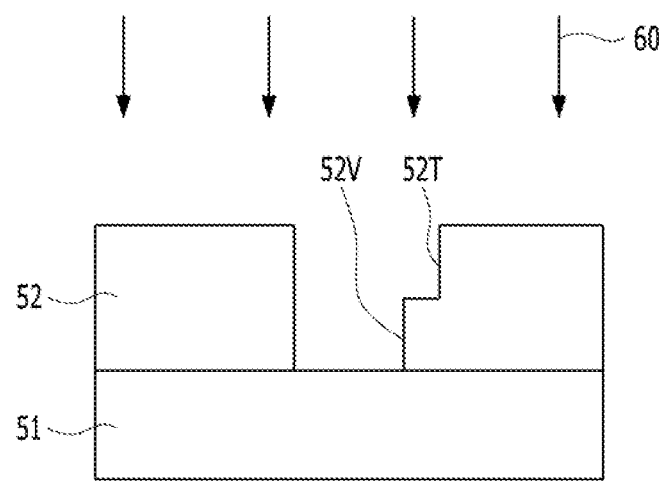

As shown in FIG. 3G, the first layer 53 may be removed. The first layer 53 may be removed by a photoresist strip process. For example, the first layer 53 may be removed by oxygen aching. Next, a cleaning process may be performed to remove etch by-products.

As described above, damage to the dielectric layer 52 in which the final via hole 52V and the trench 52T have been formed can be minimized since the dielectric layer 52 is exposed to a single strip/cleaning process 60. In another embodiment, the single strip/cleaning process 60 may be performed by a plasma strip using gas including $N_2/H_2$.

Figure 3H:
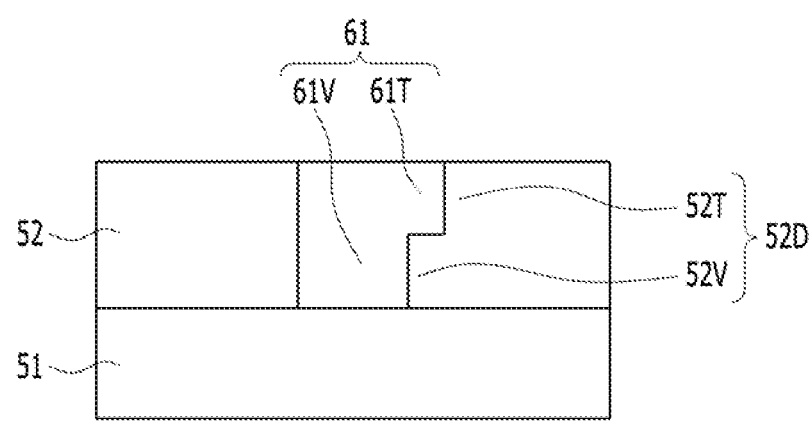

As shown in FIG. 3H, to form a dual damascene structure 61, the final via hole 52V and the trench 52T may be filled with a conductive material. The conductive material may include a metallic material. For example, the conductive material may include aluminum, copper, or tungsten. The conductive material may be exposed to a polishing process, such as CMP.

The dual damascene structure 61 may include a first portion 61V and a second portion 61T. The first portion 61V may be a portion filled in the final via hole 52V of the dual damascene opening 52D. The second portion 61T may be a portion filled in the trench 52T of the dual damascene opening 52D. The first portion 61V may be called a via or plug. The second portion 61T may be called wiring or a line pattern. When the material filled in the trench 52T is a metallic material, the second portion 61T may be called metal wiring. In another embodiment, when the substrate 51 includes lower metal wiring, the second portion 61T may be called upper metal wiring.

As described above, the third embodiment, only a single strip/cleaning process 60 is applied to the dielectric layer 52 since the via etch and the trench etch are performed at the same time. Accordingly, damage to the dielectric layer 52 can be minimized, thereby being capable of improving the reliability of the dual damascene structure 61.

Figure 3I:
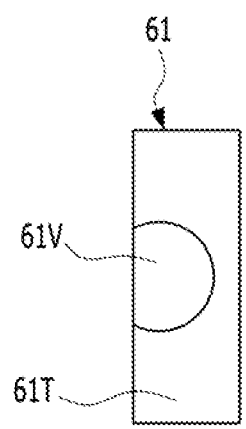
FIG. 3I is a plan view of a dual damascene structure according to the third embodiment.

FIG. 3I is a plan view of the dual damascene structure 61. The second portion 61T of the dual damascene structure 61 may fully cover or overlap the first portion 61V. The second portion 61T may be a quadrangle or a line form. The first portion 61V may be a partial circle shape. A first sidewall of the first portion 61V may be aligned with a first sidewall of the second portion 61T.

The third embodiment illustrates a method for forming, a self-alignment via. In a semiconductor device with a 20 nm grade or less, the critical dimension (CD) of the trench 52T needs to be reduced. It is difficult to reduce the CD of the trench 52T versus the final via hole 52V. Accordingly, when the final via hole 52V has the same shape as the via mask 58, a short circuit between the final via hole 52V and a neighboring trench 52T (not shown) may be generated. Accordingly, in the third embodiment, the final via hole 52V may have a width smaller than the via hole opening 58A of the via mask 58. Accordingly, a short circuit between a neighboring trench 52T (not shown) and the final via hole 52V can be prevented.

In the aforementioned embodiments, the dual damascene process is performed using a high selectivity etching between different layers. For example, the via etch and the trench etch are performed using a high selectivity between a carbon-containing material and a silicon-containing material, rather than metal. Accordingly, in the embodiments, a dual damascene process can be easily performed without employing metal. Furthermore, the embodiments are also advantageous in terms of particles since a metal layer is not used.

Although not shown, in the CMP process for forming the dual damascene structure 20, 40, or 61, a silicon-containing material may be further formed between the dielectric layer and the etch barrier to prevent damage to the dielectric layer. The silicon-containing material may serve as a capping material. The capping material may include silicon oxide, silicon nitride, silicon oxynitride. The capping material may be formed before the etch barrier is formed.

The dual damascene process according to the aforementioned embodiments may be applied to dynamic random access memory (DRAM), but not limited thereto. For example, the dual damascene process may be applied to memory, such as static random access memory (SRAM), flash memory, ferroelectic random access memory (Fe-RAM), magnetic random access memory (MRAM), and phase change random access memory (PRAM). Furthermore, the dual damascene process may be applied to a non-memory device such as a system integrated circuit.

In accordance with this technology, damage to the dielectric layer in which the via hole and the trench have been formed can be minimized since only a single strip/clearing, process is applied to the dielectric layer during a dual damascene process.

Although various embodiments have been described for illustrative purposes, it will be apparent to those skilled in the art that various changes and modifications may be made without departing from the spirit and scope of the invention as defined in the following claims.

What is claimed is:

1. A method for manufacturing a semiconductor device, comprising:
    forming a dielectric layer over an underlying layer;
    forming an etch barrier over the dielectric layer;
    forming a via mask over the etch barrier;
    partially etching the etch barrier using the via mask to form a partial via opening, wherein the partial via opening is formed in the etch barrier and exposes a lower portion of the etch barrier;
    forming an assist-etch barrier over the etch barrier to fill the partial via opening;
    forming a trench mask over the assist-etch barrier;
    patterning the assist-etch barrier using the trench mask to form an initial trench opening in the assist-etch barrier, wherein the initial trench opening communicates with the partial via opening;
    patterning the lower portion of the etch barrier exposed by the partial via opening to form a final via opening in the etch barrier;
    patterning the dielectric layer exposed by the final via opening to form an initial via hole in the dielectric layer;

patterning the etch barrier exposed by the initial trench opening to form a final trench opening in the etch barrier;

patterning a lower portion of the dielectric layer exposed by the initial via hole to form a final via hole in the dielectric layer; and patterning a upper portion of the dielectric layer exposed by the final trench opening to form a trench, wherein the trench communicates the final via hole, wherein the partial via opening is formed before the initial trench opening is formed, and wherein the final trench opening is formed over the final via hole after the final via hole is formed.

2. The method of claim 1, further comprising:
performing a single strip/cleaning process after the forming of the final via hole and the trench.

3. The method of claim 1,
wherein a depth of the initial via hole in the dielectric layer is smaller than a thickness of the dielectric layer.

4. The method of claim 1,
wherein (i) the patterning a lower portion of the dielectric layer exposed by the initial via hole and (ii) the patterning a upper portion of the dielectric layer exposed by the final trench opening are performed substantially at the same time.

5. The method of claim 1,
wherein the forming of the etch barrier comprises:
forming a first layer over the dielectric layer; and
forming a second layer over the first layer,
wherein the forming of the partial via opening comprises:
forming the via mask over the second layer;
patterning the second layer using the via mask; and
partially etching the first layer using the via mask to form the partial via opening.

6. The method of claim 5,
wherein a depth of the partial via opening in the first layer is smaller than a thickness of the first layer.

7. The method of claim 5,
wherein the first layer comprises amorphous carbon layer.

8. The method of claim 5,
wherein the second layer comprises SiON.

9. The method of claim 1, wherein the forming of the assist-etch barrier comprises:
forming a bottom layer covering the etch barrier and filling the partial via opening; and
forming a top layer over the bottom layer.

10. The method of claim 9,
wherein the bottom layer includes a carbon layer and is formed by spin-on coating.

11. The method of claim 9,
wherein the top layer comprises SiON.

* * * * *